US006940008B2

(12) United States Patent
Shiotsuka et al.

(10) Patent No.: US 6,940,008 B2
(45) Date of Patent: Sep. 6, 2005

(54) SEMICONDUCTOR DEVICE, SOLAR CELL MODULE, AND METHODS FOR THEIR DISMANTLEMENT

(75) Inventors: Hidenori Shiotsuka, Kyotanabe (JP); Ichiro Kataoka, Kyotanabe (JP); Satoru Yamada, Nara (JP); Shigeo Kiso, Kyotanabe (JP); Hideaki Zenko, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

(21) Appl. No.: 10/876,666

(22) Filed: Jun. 28, 2004

(65) Prior Publication Data

US 2005/0000560 A1 Jan. 6, 2005

Related U.S. Application Data

(62) Division of application No. 09/244,163, filed on Feb. 4, 1999, now abandoned.

(30) Foreign Application Priority Data

Feb. 5, 1998 (JP) ........................................... 10-024370
Feb. 2, 1999 (JP) ............................................ 11-24968

(51) Int. Cl.[7] ........................ H01L 31/048; H01L 31/18

(52) U.S. Cl. ....................... 136/251; 136/256; 136/244; 136/290; 438/64; 438/66; 438/759; 438/107; 438/115; 438/118; 438/127; 257/459; 257/632; 257/466; 257/433; 257/434

(58) Field of Search ................................ 136/251, 256, 136/244, 290; 438/64, 66, 759, 107, 115, 118, 127; 257/459, 632, 466, 433, 434

(56) References Cited

U.S. PATENT DOCUMENTS

| | | | |
|---|---|---|---|
| 3,810,252 A | 5/1974 | Leister et al. | 174/51 |
| 4,057,439 A | 11/1977 | Lindmayer | 136/89 |
| 4,078,098 A | 3/1978 | Cortellino | 427/43 |
| 4,268,590 A | 5/1981 | Eranian et al. | 430/5 |

(Continued)

FOREIGN PATENT DOCUMENTS

| | | |
|---|---|---|
| CN | 1114467 A | 1/1996 |
| DE | 195 39 699 | 4/1997 |
| EP | 0 631 328 | 12/1994 |
| EP | 0 680 095 | 11/1995 |
| EP | 0 680 097 | 11/1995 |
| EP | 0 762 514 | 3/1997 |
| EP | 0 893 250 | 1/1999 |
| JP | 2-46796 | 2/1990 |
| JP | 5-55617 A * | 3/1993 |
| JP | 9-45951 | 2/1997 |

OTHER PUBLICATIONS

Bohland et al, "Possibility of Recycling Silicon PV Modules," 26th PVSC, Sep. 30 to Oct. 3, 1997, pp. 1173–1175.*
T.M. Bruton, et al., "Re–Cycling of High Value, High Energy Content Components of Silicon PV Modules", 12$^{th}$ European Photovoltaic Solar Energy Conf., Amsterdam, pp. 303–304. (1994).
Patent Abstracts of Japan, vol. 1998, No. 03, Feb. 27, 1998 (corresponds to JP 09–289104).
J.R. Bohland, et al., "Possibility of Recycling Silicon PV Modules", 26$^{th}$ PVSC, Anaheim, CA, pp. 1173–1175 (1997).
Patent Abstracts of Japan, vol. 017, No. 356 (E–1394), Jul. 6, 1993 (corresponds to JP 05–055617).

*Primary Examiner*—Alan Diamond
(74) *Attorney, Agent, or Firm*—Fitzpatrick, Cella, Harper & Scinto

(57) ABSTRACT

A solar cell module comprising a substrate, a filler, a photovoltaic element and a protective layer, wherein at least one of the substrate, the filler, the photovoltaic element and the protective layer is separable from other constituent members. Constituent members having been separated and still serviceable can be reused.

10 Claims, 4 Drawing Sheets

U.S. PATENT DOCUMENTS

| | | | | | |
|---|---|---|---|---|---|
| 4,406,913 | A | | 9/1983 | Weyrich | 136/259 |
| 4,409,319 | A | | 10/1983 | Colacino et al. | 430/296 |
| 4,888,062 | A | * | 12/1989 | Nakagawa et al. | 136/258 |
| 5,028,484 | A | | 7/1991 | Martin et al. | 428/352 |
| 5,120,384 | A | | 6/1992 | Yoshimitsu et al. | 156/242 |
| 5,215,598 | A | | 6/1993 | Kouzuma et al. | 136/251 |
| 5,397,713 | A | | 3/1995 | Hamamoto et al. | 437/4 |
| 5,464,878 | A | | 11/1995 | Nemphos et al. | 521/50 |
| 5,578,141 | A | | 11/1996 | Mori et al. | 257/433 |
| 5,651,837 | A | | 7/1997 | Ohtsuka et al. | 136/251 |
| 5,660,645 | A | | 8/1997 | Mori et al. | 257/433 |
| 5,660,646 | A | | 8/1997 | Kataoka et al. | 136/251 |
| 5,684,325 | A | | 11/1997 | Kataoka et al. | 257/433 |
| 5,728,230 | A | * | 3/1998 | Komori et al. | 136/251 |
| 5,759,291 | A | | 6/1998 | Ichinose et al. | 257/459 |
| 5,861,324 | A | | 1/1999 | Ichinose et al. | 438/119 |
| 5,905,429 | A | * | 5/1999 | Hornstein et al. | 340/384.6 |
| 5,942,048 | A | | 8/1999 | Fujisaki et al. | 257/459 |
| 5,973,258 | A | | 10/1999 | Shiotsuka et al. | 438/64 |
| 5,986,203 | A | | 11/1999 | Hanoka et al. | 257/433 |
| 6,001,488 | A | | 12/1999 | Kataoka et al. | 428/447 |
| 6,042,894 | A | | 3/2000 | Goto et al. | 437/504 |
| 6,063,995 | A | | 5/2000 | Bohland et al. | 136/243 |
| 6,075,202 | A | | 6/2000 | Mori et al. | 136/251 |
| 6,093,581 | A | | 7/2000 | Takabayashi | 438/64 |
| 6,113,718 | A | | 9/2000 | Yamada et al. | 156/78 |
| 6,130,379 | A | | 10/2000 | Shiotsuka et al. | 257/433 |
| 6,133,522 | A | | 10/2000 | Kataoka et al. | 136/259 |
| 6,153,299 | A | | 11/2000 | Smith et al. | 428/372 |
| 6,175,075 | B1 | | 1/2001 | Shiotsuka et al. | 136/251 |
| 6,184,577 | B1 | | 2/2001 | Takemura et al. | 257/701 |
| 6,265,242 | B1 | | 7/2001 | Komori et al. | 257/431 |
| 6,294,724 | B1 | * | 9/2001 | Sasaoka et al. | 136/251 |
| 6,320,115 | B1 | | 11/2001 | Kataoka et al. | 136/251 |
| 2002/0034796 | A1 | | 3/2002 | Shastri et al. | 435/173.1 |

* cited by examiner

SEMICONDUCTOR DEVICE, SOLAR CELL MODULE, AND METHODS FOR THEIR DISMANTLEMENT

This is a divisional application of application Ser. No. 09/244,163, filed Feb. 4, 1999, abandoned.

BACKGROUND OF THE INVENTION

FIELD OF THE INVENTION

This invention relates to a semiconductor device as exemplified by a solar cell module, which comprises a supporting substrate, a filler and a semiconductor element as exemplified by a photovoltaic element.

In recent years, solar cell modules are used in various purposes, one of which is a construction material integral type solar cell module comprising photovoltaic elements provided on a roofing steel sheet and covered with a filler. In future, solar cell modules may become useless because of reconstruction of houses provided with solar cell modules as construction materials, or it may become necessary that they are reroofed or exchanged because of corrosion of metal substrates as a result of outdoor long-term service or because of cracks produced in surface members on the light-receiving side. Thus, when solar cell modules having become useless are discarded, we are anxious about environmental pollution unless individual constituent members are separated from one another and sorted so as to be discarded properly, and it has become required for solar cell modules to be separable by individual constituent members. From the viewpoint of ecology, it is also required for them to be dismantled into utilizable members and to be reused. Japanese Patent Application Laid-Open No. 9-45951 discloses a peelable adhesive layer provided in a solar cell on its light-receiving side.

In the prior art, no proposal has been made on a specific method by which solar cell modules are dismantled into photovoltaic elements and substrates so that they can be reused.

SUMMARY OF THE INVENTION

An object of the present invention is to provide a solar cell module whose reusable constituent members can be separated, and a method for dismantling such a solar cell module.

To achieve the above object, the present invention provides a semiconductor device comprising a substrate, a filler and a semiconductor element, wherein the semiconductor element is separable from the substrate.

The present invention provides a process for producing a semiconductor device having a substrate, a filler and a semiconductor element; the process comprising the step of producing the semiconductor device in such a way that the semiconductor element is separable from the substrate.

The present invention provides a method of dismantling a semiconductor device having a substrate, a filler and a semiconductor element; the method comprising separating the semiconductor element from the substrate.

The present invention provides a solar cell module comprising a substrate, a filler, a photovoltaic element and a protective layer, wherein the photovoltaic element is separable from the substrate.

The present invention provides a process for producing a solar cell module having a substrate, a filler, a photovoltaic element and a protective layer; the process comprising the step of producing the solar cell module in such a way that the photovoltaic element is separable from the substrate.

The present invention provides a method of dismantling a solar cell module having a substrate, a filler, a photovoltaic element and a protective layer; the method comprising separating the photovoltaic element from the substrate.

The present invention provides a semiconductor device comprising a substrate, a filler and a semiconductor element, wherein at least one of the substrate, the filler and the semiconductor element is separable from the other constituent members by heaing the semiconductor device.

The present invention provides a semiconductor device comprising a substrate, a filler and a semiconductor element, wherein at least one of the substrate, the filler and the semiconductor element is separable from the other constituent members by heating and moistening the semiconductor device.

The present invention provides a semiconductor device comprising a substrate, a filler and a semiconductor element, wherein at least one of the substrate, the filler and the semiconductor element is separable from the other constituent members by irradiating the semiconductor device with electron rays.

The present invention provides a semiconductor device comprising a substrate, a filler and a semiconductor element, wherein at least one of the substrate, the filler and the semiconductor element is separable from the other constituent members by immersing the semiconductor device in a liquid.

The present invention provides a solar cell module comprising a substrate, a filler, a photovoltaic element and a protective layer, wherein at least one of the substrate, the filler, the photovoltaic element and the protective layer is separable from the other constituent members by heating the solar cell module.

The present invention provides a solar cell module comprising a substrate, a filler, a photovoltaic element and a protective layer, wherein at least one of the substrate, the filler, the photovoltaic element and the protective layer is separable from the other constituent members by heating and moistening the solar cell module.

The present invention provides a solar cell module comprising a substrate, a filler, a photovoltaic element and a protective layer, wherein at least one of the substrate, the filler, the photovoltaic element and the protective layer is separable from the other constituent members by irradiating the solar cell module with electron rays.

The present invention provides a solar cell module comprising a substrate, a filler, a photovoltaic element and a protective layer, wherein at least one of the substrate, the filler, the photovoltaic element and the protective layer is separable from the other constituent members by immersing the solar cell module in a liquid.

The present invention provides a method of dismantling a semiconductor device having a substrate, a filler and a semiconductor element; the method comprising heating the semiconductor device to separate at least one of the substrate, the filler and the semiconductor element from the other constituent members.

The present invention provides a method of dismantling a semiconductor device having a substrate, a filler and a semiconductor element; the method comprising heating and moistening the semiconductor device to separate at least one of the substrate, the filler and the semiconductor element from the other constituent members.

The present invention provides a method of dismantling a semiconductor device having a substrate, a filler and a semiconductor element; the method comprising irradiating the semiconductor device with electron rays to separate at least one of the substrate, the filler and the semiconductor element from the other constituent members.

The present invention provides a method of dismantling a semiconductor device having a substrate, a filler and a semiconductor element; the method comprising immersing the semiconductor device in a liquid to separate at least one of the substrate, the filler and the semiconductor element from the other constituent members.

The present invention provides a method of dismantling a solar cell module having a substrate, a filler, a photovoltaic element and a protective layer; the method comprising heating the solar cell module to separate at least one of the substrate, the filler, the photovoltaic element and the protective layer from the other constituent members.

The present invention provides a method of dismantling a solar cell module having a substrate, a filler, a photovoltaic element and a protective layer; the method comprising heating and moistening the solar cell module to separate at least one of the substrate, the filler, the photovoltaic element and the protective layer from the other constituent members.

The present invention provides a method of dismantling a solar cell module having a substrate, a filler, a photovoltaic element and a protective layer; the method comprising irradiating the solar cell module with electron rays to separate at least one of the substrate, the filler, the photovoltaic element and the protective layer from the other constituent members.

The present invention provides a method of dismantling a solar cell module having a substrate, a filler, a photovoltaic element and a protective layer; the method comprising immersing the solar cell module in a liquid to separate at least one of the substrate, the filler, the photovoltaic element and the protective layer from the other constituent members.

DESCRIPTION OF THE PREFERRED EMBODIMENTS

Figure 1A:
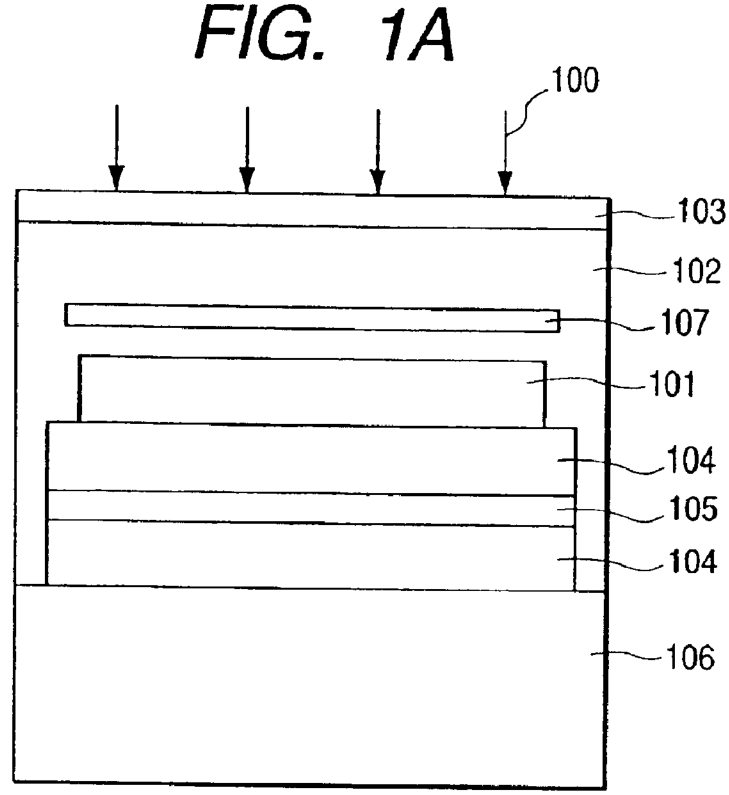
FIG. 1A is a cross-sectional view of a film type solar cell module of the present invention.
Figure 1B:
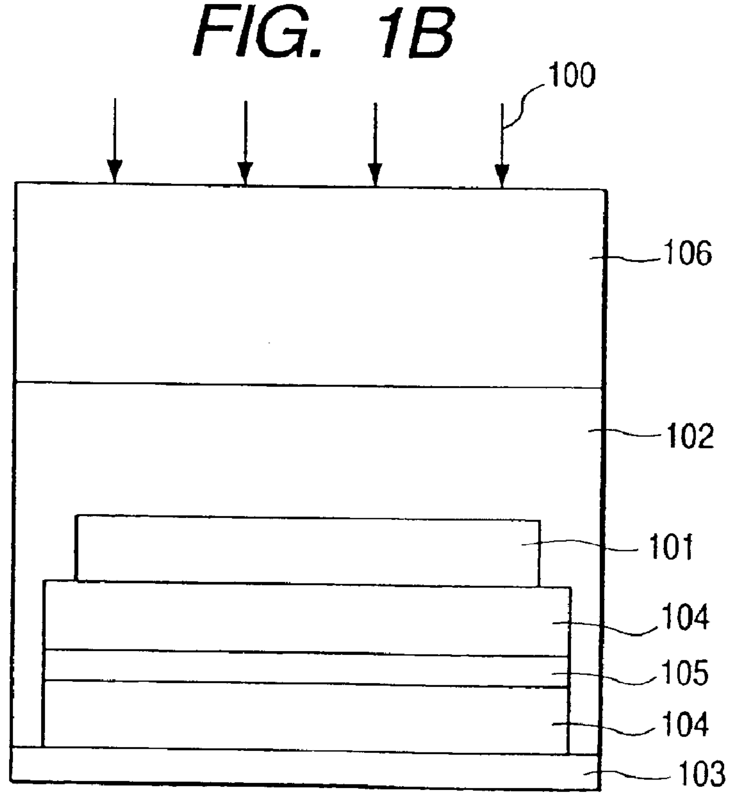
FIG. 1B is a cross-sectional view of a glass type solar cell module of the present invention.

An example of a semiconductor device as exemplified by a solar cell module, used in the present invention will be described with reference to FIGS. 1A and 1B. FIG. 1A illustrates a film type solar cell module in which a transparent film is used at the outermost surface. FIG. 1B illustrates a glass type solar cell module in which a glass sheet is used at the outermost surface. Reference numeral 100 denotes incident light; 101, a photovoltaic element (in plurality); 102, a surface-side filler; 103, a protective layer (a protective member); 104, a back-side filler; 105, a back insulating material; and 106, a supporting substrate (a back member).

As the photovoltaic element (in plurality) 101, conventionally known photovoltaic elements may appropriately be used. These members denoted by reference numerals 101 to 106 are all constituent members that make up a solar cell module. The photovoltaic elements are embedded in the module without leaving any vacancies, by at least one of the surface-side filler and back-side filler detailed below.

(Surface-Side Filler 102)

The surface-side filler 102 covers unevenness of semiconductor elements exemplified by the photovoltaic elements 101, protects the photovoltaic elements 101 from severe external environment such as temperature changes, humidity and impact and also can ensure adhesion between the protective layer 103 and the photovoltaic elements 101. This surface-side filler 102 is required to have weatherablility, adhesion, fill performance, heat resistance, cold resistance and impact resistance. Resins that can meet these requirements may include polyolefin resins such as ethylene-vinyl acetate copolymer (EVA), ethylene-methyl acrylate copolymer (EMA), ethylene-ethyl acrylate copolymer (EEA) and butyral resin, urethane resins, and silicone resins. In particular, EVA is a resin used preferably as a resin for solar cells.

This EVA may preferably be cross-linked beforehand so that it can have a higher heat distortion temperature to have a higher heat resistance. As cross-linking agents used in such an instance, known organic peroxides may be used, any of which may be added in an amount of from 0.5 to 5 parts by weight based on 100 parts by weight of the resin. The surface-side filler 102 may preferably be cross-linked by at least 70%.

The filler (or filler member) thus cross-linked, though it may have a heat resistance to the extent of about 120° C., may preferably have such properties that it softens by high-temperature heat of 200° C. or above. Namely, a filler member is preferred which has a heat resistance to a certain extent but softens at a certain temperature or above. More preferred is a filler member which, once it softens, comes to have a low adhesion to a constituent member adjoining to the filler member. Use of such a filler member makes it possible to separate constituent members by heating, between the constituent members interposing the filler. Specific materials therefor may include polyolefin resins such as ethylene-vinyl acetate copolymer (EVA), ethylene-methyl acrylate copolymer (EMA), ethylene-ethyl acrylate copolymer (EEA) and butyral resin, and ionomer resins. In the present invention, this surface-side filler member may also be made separable.

In order to ensure the long-term reliability, an ultraviolet light absorber, a photostabilizer and an antioxidant may also be added to the surface-side filler 102.

(Protective Layer 103)

The protective layer 103 can ensure long-term reliability during outdoor weathering of the solar cell module, including weatherability and mechanical strength. Materials for this protective layer 103 may include fluorine resins, acrylic resins, polyvinyl fluoride resin (PVF), polyethylene terephthalate (PET) and nylon. Stated specifically, in the case of a film type solar cell module, it is preferable to use polyvinylidene fluoride resin (PVDF), polyvinyl fluoride resin (PVF) or tetrafluoroethylene-ethylene copolymer (ETFE); and, in the case of a glass type solar cell module, polyvinyl fluoride (PVF) as having a high weatherability.

A sheet-like resin formed of the above resin may be provided in contact with the surface-side filler 102 to form the protective layer. Alternatively, a liquid resin of the above resin may be coated on the surface-side filler 102 to form the protective layer.

(Back Insulating Material 105)

The back insulating material 105 can keep electrical insulation between the photovoltaic elements 101 and the exterior. Preferable materials are those having sufficient electrical insulating properties, having a superior long-term durability, able to withstand thermal expansion and thermal constriction, and having a flexibility also. Materials preferably usable may include nylon, polyethylene terephthalate (PET) and polycarbonate (PC).

(Back-Side Filler 104)

The back-side filler 104 can make the photovoltaic elements 101 adhere to the back insulating material 105. Materials therefor may include thermoplastic resins such as EVA, ethylene-methyl acrylate copolymer (EMA), ethylene-ethyl acrylate copolymer (EEA) and polyvinyl butyral, and epoxy adhesives having a flexibility, any of which may preferably be in the form of a double-coated tape. In the present invention, the semiconductor elements can be made separable from the substrate at this back-side filler. Thus, whichever member has deteriorated, the substrate or the semiconductor element, and has to be changed for new one, either necessary one can be reused and either unusable one can be discarded with ease. As the result, cost reduction can be achieved or operating efficiency can be improved. The back-side filler itself may be provided as an exfoliative layer described later.

(Supporting Substrate 106)

The supporting substrate (back-side member) 106 can make the solar cell module have a higher mechanical strength, or can prevent its distortion or warpage caused by temperature changes. The supporting substrate 106 is also attached in order to set up a roofing material integral type solar cell module. As the supporting substrate 106, preferred are, e.g., coated steel sheets such as aluminum-coated galvanized steel sheets or galvanized steel sheets, covered with resins having superior weatherability and rust resistance, and structural materials such as plastic sheets and glass-fiber-reinforced plastic sheets. In particular, as the coated steel sheets, preferably usable are those in which a hydrated chromium oxyhydroxide layer is provided between the steel sheet and the coating film for the purpose of rust-resisting treatment. This is because, under severe heated and moistened conditions, e.g., under conditions of 150° C. and 100% RH (relative humidity), hydrated chromium oxyhydroxide melts out and becomes deposited to form a vacancy between the steel sheet and the coating film. Such a vacant layer between the steel sheet and the coating film may be utilized to separate the constituent members. In the present invention, the semiconductor element as exemplified by the photovoltaic element can be separated from the substrate (supporting substrate 106). The constituent member can be changed for new one with ease whichever member has deteriorated, the substrate or the semiconductor element, and has to be changed for new one. Hence, constituent members which are still serviceable can be reused and even constituent members which are no longer serviceable can be discarded with ease. As the result, cost reduction can be achieved or operating efficiency can be improved. Moreover, in such an instance, the semiconductor element, which is surrounded by the back-side filler, can be changed for new one with ease without its exposure to the open air even when the structural material is separated.

In the case of the glass type solar cell module, a glass substrate may preferably be used, and the glass substrate 106 is provided on the side opposite to the light-receiving side (FIG. 1B).

(Surface Protection Reinforcing Material 107)

A surface protection reinforcing material 107 may be provided optionally in the surface-side filler 102. The surface protection reinforcing material 107 may specifically include glass-fiber nonwoven fabric, glass-fiber woven fabric and glass fillers. In particular, it is preferable to use glass-fiber nonwoven fabric. This surface protection reinforcing material 107 can protect the photovoltaic elements 101 so as to prevent their light-receiving surfaces from being scratched.

The step of lamination to form the solar cell module will be described below.

(Lamination)

To produce the film type solar cell module by lamination, the supporting substrate 106, the back-side filler 104, the back insulating material 105, the back-side filler 104 are superposed in this order, and then the photovoltaic elements 101 are put thereon with their light-receiving sides up. Further thereon, the surface protection reinforcing material 107 (optionally), the surface-side filler 102 and the protective layer 103 are superposed in this order. To produce the glass type solar cell module by lamination, the protective layer 103, the back-side filler 104, the back insulating material 105, the back-side filler 104 are superposed in this order, and then the photovoltaic elements 101 are put thereon with their light-receiving sides up. Further thereon, the surface protection reinforcing material 107 (optionally), the surface-side filler 102 and the glass substrate 106 are superposed in this order. A lamination structure thus formed may be heated and contact-bonded by means of a conventionally known vacuum laminator. The heating temperature and heating time at the time of the contact bonding may be determined so that the cross-linking reaction of the filler resin may proceed sufficiently.

The solar cell module thus produced is dismantled by separating any desired constituent members at their interface. Methods therefor may include a method in which the constituent members are separated by heating, a method in which they are separated by heating and moistening, a method in which they are separated by boiling, and a method in which the solar cell module is immersed in a solvent to cause the filler to swell to effect separation. In particular, the separation by heating and the separation by heating and moistening may preferably be used. As an example of the dismantling method of the present invention, a method in which constituent members having EVA are separated will be described below, giving an example in which EVA is used as the filler of the solar cell module.

(1) Separation of Constituent Members by Heating:

The lamination to produce the solar cell module is commonly carried out at a temperature in the range of from 100 to 180° C., and preferably from 120 to 160° C. This is because, if the temperature is below 100° C., the EVA can not melt well, in other words, can not provide a good fluidity, so that the unevenness on the photovoltaic elements can not be filled up, and also, if it is above 180° C., there is a possibility that the solder used to make connection between photovoltaic elements and their connection with bypass diodes may melt to cause faulty electrical connection. In addition, solar cell modules may come to have a module surface temperature of 85° C. during sunshine. In order to achieve long-term reliability for 20 years or longer in such environment, materials having substantially a resistance to heat of about 120° C. are used as the EVA used in solar cell modules. Accordingly, in order to cause the EVA to soften so as to decrease the adhesion to the adjoining other constituent members, the EVA is heated to 130° C. or above, during which an external peel force may be applied between the constituent members interposing the EVA, whereby the constituent members can be separated from the solar cell module with ease. Thus, in the present invention, the desired constituent members can be separated at their interface with ease by heating the constituent members. In an instance where the filler has a low heat resistance, the heating temperature for the exfoliating may be set lower.

(2) Separation of Constituent Members by Heating and Moistening:

EVA hydrolyzes under heated and moistened conditions of, e.g., 150° C. and 100% RH. As a result of hydrolysis, the EVA decreases in its adhesion to the constituent member such as the supporting substrate or the protective layer. This decrease in adhesion of the EVA to other constituent member is utilized so that a certain constituent member can be separated from other constituent member with ease. Thus, in the present invention, the constituent members are heated and moistened, whereby any desired constituent member can be separated from the solar cell module. Needless to say, the higher the values for temperature and humidity conditions are, the more the hydrolysis is accelerated. Application of pressure to the atmosphere also accelerates the progress of water into the solar cell module. Such pressure may preferably be applied under conditions of at least 2 atmospheric pressure, and more preferably at least 5 atmospheric pressure.

According to the present invention, any of the above methods makes it possible to separate the protective layer 103 or the substrate 106, the surface protection reinforcing material 107 and the back insulating material 105 and thereafter to remove the surface-side filler 102 or back-side filler 104 remaining on the surface or back of the photovoltaic elements 101, so that only the photovoltaic elements 101 can be reused. According to the present invention, it is also possible to separate resin materials from metal materials to discard them. It is still also possible to remove the filler resin such as EVA remaining on the surfaces of the photovoltaic elements, which can be removed using an acid such as nitric acid, or an alkali or organic solvent, heated to, e.g., 50° C. or above.

(Exfoliative Layer)

An exfoliative layer formed of, e.g., a thermoplastic resin, a degradable resin or a foam may also be provided in the solar cell module. The exfoliative layer may be provided in the solar cell module preferably at its part where any constituent member is to be separated. Alternatively, the filler member(s) surface-side filler 102 and/or back-side filler 104 may be replaced with this exfoliative layer. An exfoliative layer preferably usable will be described below.

A thermoplastic resin may be provided as the exfoliative layer. This enables easy separation of constituent members by heating. As the thermoplastic resin, the same resin as the resin used in the filler member may preferably be used. Taking account of reuse of the constituent members obtained by separation, it is preferable not to apply stress such as heat history as far as possible when the constituent members are separated by heating. Stated specifically, a thermoplastic resin which does not cross-link may be used to provide the exfoliative layer, whereby the constituent members can be separated at a temperature lower than the instance where the constituent members are separated at the part of the filler. In the case where the thermoplastic resin is provided as the exfoliative layer, the constituent members can be separated at a temperature of 150° C. or below. For example, when non-crosslinking EVA is provided as the exfoliative layer, the constituent members can be separated at a temperature of from 100 to 120° C. Transparent thermoplastic resins such as EVA can be provided at any position because it by no means lowers the quantity of electricity generation of the solar cell module even when provided on the photovoltaic elements. In order to ensure the long-term reliability, an ultraviolet light absorber, a photostabilizer and an antioxidant may also be added as in the case of the surface-side filler 102.

Thus, in the present invention, when the exfoliative layer formed of a thermoplastic resin is provided in the solar cell module, the heating temperature for separation can be set lower.

An instance where the degradable resin is provided as the exfoliative layer will be described below.

Resins can be degraded (broken down) by a method including electron ray irradiation and biochemical means. Herein, degradation of resin by electron ray irradiation will be described, as being preferably usable. Electron rays are included in ionizing radiations, and are one of particle energy rays which excite organic materials to ionize them. Electron rays can be controlled by adjusting accelerating voltage, radiation dose, radiation dose rate and so forth. Electron rays are applied to the solar cell module on its light-receiving side to cause molecular chains in the resin to cut to degrade the resin. Thus, the constituent members can be separated with ease between constituent members interposing the electron ray degradable resin layer thus degraded.

Resins readily degradable by electron ray irradiation may include those having a chemical structure wherein ($—CH_2—CR_1—R_{2n}—$) or —CO— is repeated structurally. Stated specifically, resins having the structure of the repeating unit ($—CH_2—CR_1—R_{2n}—$) may include polyisobutylene, polymethyl styrene, polymethacrylate, polymethacrylonitrile and polyvinylidene chloride. Resins having the structure of the repeating unit —CO— may include polycarbonate (PC), polyacetal and cellulose. The degradable resin need not necessarily be cross-linked.

The above resin may be provided at any desired position. In the case where it is provided on the light-receiving side of the photovoltaic elements, it should be a transparent resin. In order to improve weatherability, an ultraviolet light absorber and an antioxidant may also be added as in the case of the surface-side filler.

As methods for providing the electron ray degradable resin layer, the above resin may be coated on the part where constituent members are to be separated, e.g., on the supporting substrate. Alternatively, a film formed of the above resin may be provided at that part.

The accelerating voltage may be set in the manner as described below. The accelerating voltage necessary for electron rays to be transmitted through a substance becomes greater in inverse proportion to the specific gravity the substance has. For example, in order for electron rays to be transmitted through a metal member having a specific gravity of 8, it is necessary to apply an accelerating voltage eight times that necessary for them to be transmitted through a resin having a specific gravity of 1. Accordingly, in the present invention, in an instance where the electron ray degradable resin layer is provided on the back of the photovoltaic elements, it is necessary to apply an accelerating voltage of at least 500 keV in order for electron rays to be transmitted through the photovoltaic elements to degrade the exfoliative layer on the back. This makes it necessary to provide large-scale equipment. In order to separate constituent members in relatively simple equipment, the degradable resin layer may preferably be provided on the photovoltaic elements in the case where the constituent members are separated at the exfoliative layer by electron ray irradiation. Taking account of the reuse of the photovoltaic elements separated, the electron rays may preferably be applied at an accelerating voltage of 300 keV or below.

As another structure, a foam formed when the solar cell module is dismantled by heating may be used as the exfoliative layer. The foam can be formed by a chemical process in which a foam precursor prepared by mixing a resin and a blowing agent is heated to produce cells in the resin by the action of the decomposed gas of the blowing agent, or a physical process in which an inert gas is enclosed in the resin.

First, a method will be described in which the foam is provided in the solar cell module by the chemical process.

The foam precursor is provided in the solar cell module, between its constituent members to be separated, and, when the constituent members are separated, the foam precursor is heated to make the blowing agent decompose to form the foam by the action of the decomposed gas. The foam precursor has a large area of adhesion to the adjoining constituent members and hence has also a great adhesion, thus the foam precursor by no means causes any peeling at the interface between it and the constituent members. However, upon blowing, the area of adhesion to the constituent members adjoining to the foam formed becomes small abruptly to cause a decrease in adhesion, thus it becomes easy to separate the constituent members at their interfaces to the exfoliative layer. Also, since the interior of the foam has come to have a small cohesive force because of the cells mixedly present, it is easy to cause cohesive failure in the interior of the foam by external peel force. Further addition of heat enables more easy separation.

For the purpose of maintaining the quality of the foam and preventing the interior of cells in the foam from sweating because of temperature changes, the step of forming the foam may most preferably be so provided as to blow the foam precursor immediately before the constituent member are separated. Also, the blowing agent is required to have such heat decomposition properties that it is not decomposed at heating temperature at the time of the lamination for producing the solar cell module, i.e., at lamination temperature, but expands at heating temperature for separating the constituent members, i.e., at a temperature higher than the lamination temperature. For example, the blowing agent may include those having a decomposition temperature of 200° C. or above, specifically including trihydrazinotriazine, p-toluenesulfonyl semicarbaside and 4,4'-oxybisbenzenesulfonyl semicarbaside.

The resin in which the blowing agent is mixed is required to have a long-term reliability like other constituent members until the constituent members are right about to be separated, and is also required to have an adhesion strength between it and the supporting substrate adjoining to the foam precursor or between it and the filler member. As specific materials, it may include natural rubber, styrene-butadiene rubber, chloroprene rubber, ethylene-propylene rubber, and copolymers of ethylene with acrylic esters, such as ethylene-vinyl acetate and ethylene-ethyl acrylate copolymers.

A foam may be subjected to moistureproofing or waterproofing treatment on its surroundings so that a foam having already been formed can be provided in the solar cell module. At the time the laminate is produced by lamination, the foam precursor may be superposed at the desired position so that it is blown by the heat in the step of lamination to provide the foam in the solar cell module. As a blowing agent used in such an instance, it may include inorganic blowing agents such as sodium bicarbonate, ammonium bicarbonate and ammonium carbonate, and organic blowing agents such as nitroso compounds and sulfonic acid hydrazide compounds.

The foam may also be disposed at any desired position of the lamination structure comprised of superposed constituent members, followed by lamination to provide it as the exfoliative layer of the solar cell module.

Such a foam can be formed by a method including a chemical means and a physical means.

The chemical means is the same as the blowing means making use of the blowing agent described above. The physical means will be described below.

The physical means is a method of forming a foam by injecting a gas into a resin. The resin used is required to have such a heat resistance that it does not melt by the heat applied in the step of lamination. Stated specifically, it may include polyethylene terephthalate, polyethylene naphthalate, polyether sulfonate, polyimide, polyimide-amide and polyether imide. The gas to be mixed may preferably be an inert gas such as nitrogen. The gas may be mixed into the resin by a known process such as cavity mixing or nozzle mixing. The solar cell module having such a foam can be dismantled by heating the solar cell module so that the resin used in the foam is caused to melt or soften to break the foam by the aid of pressure of the gas enclosed therein, thus the constituent members interposing the exfoliative layer can be separated.

The foam or the foam precursor may be disposed between any constituent members. It may preferably be provided on the back of the photovoltaic elements especially when the foam precursor has a color or has a low transparency.

EXAMPLES

Example 1

Figure 2:
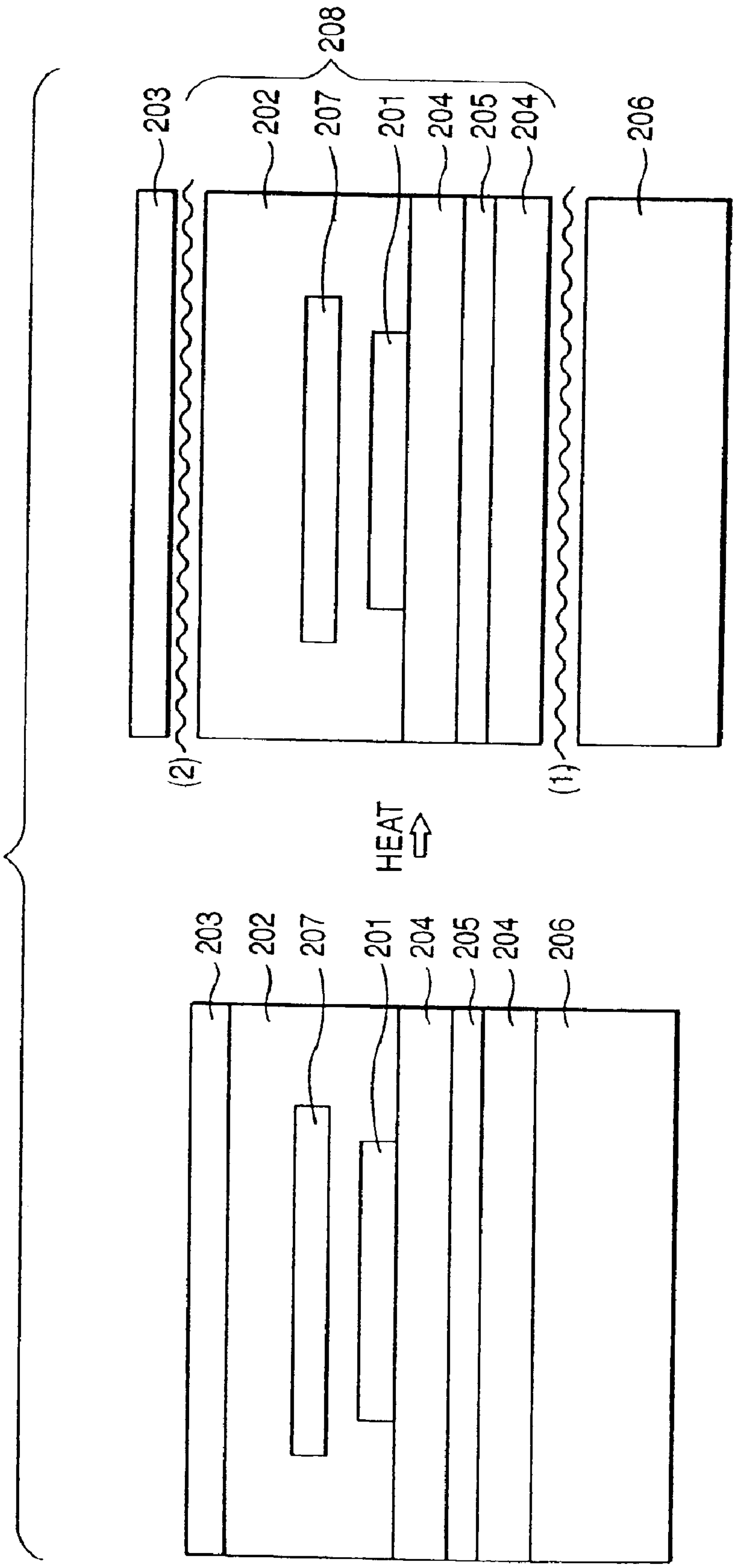
FIG. 2 illustrates a method of dismantling a solar cell module by heating according to the present invention, as shown in Example 1.

Photovoltaic elements and other constituent members were laminated by the following lamination process to obtain a film type solar cell module, as shown in FIG. 2.

(Lamination)

On a plate of a laminator of a single vacuum system, a galvanized steel sheet (thickness: 0.4 mm) as a supporting substrate 206 as shown in FIG. 2, an EVA sheet (thickness: 225 μm) as a back-side filler 204, a polyethylene terephthalate film (thickness: 100 μm) as a back insulating material 205 and the same back-side filler 104 as the above were superposed in this order and then photovoltaic elements 201 were put thereon with their light-receiving sides up. Further thereon, glass-fiber nonwoven fabric (basis weight: 80 $g/m^2$) as a surface protection reinforcing material 207, an EVA sheet (thickness: 460 μm) as a surface-side filler 202 and an ETFE film (thickness: 50 μm) as a protective layer 203 were superposed in this order. Thus, a lamination structure was prepared. The EVA sheet used here was a sheet used widely as a filler for solar cells, comprising EVA resin (vinyl acetate content: 33%) in 100 parts by weight of which 1.5 parts by weight of 2,5-dimethyl-2,5-bis(t-butylperoxy)hexane as a cross-linking agent, 0.3 part by weight of 2-hydroxy-4-n-octoxybenzophenone as an ultraviolet light absorber, 0.1 part by weight of bis(2,2,6,6-tetramethyl-4-piperidyl) sebacate as a photostabilizer, 0.2 part by weight of tris (mononoylphenyl) phosphite as an antioxidant and 0.25 part by weight of γ-methacryloxypropyltrimethoxysilane as a silane coupling agent were compounded.

Next, a teflon coated fiber sheet (thickness: 0.2 mm) and a silicone rubber sheet (thickness: 2.3 mm) were superposed on the lamination structure. Then, the inside of a laminator was evacuated for 30 minutes to a degree of vacuum of 2.1 Torr by means of a vacuum pump. The heating temperature and heating time at the time of contact bonding were so set that the cross-linking reaction of the EVA resin proceeded sufficiently, where the laminator kept evacuated using the vacuum pump was put into an oven heated previously to have an atmosphere of 160° C. and was kept there for 50 minutes. Thereafter, the laminate thus produced was taken out and cooled to obtain a solar cell module.

(Separation)

The solar cell module was heated to 200° C., and a mechanical exfoliative force (1) was applied between the supporting substrate 206 and the back-side filler 204 while making the surface- and back-side fillers melt, thus a laminate 208 having the photovoltaic elements was separated from the supporting substrate 206. Next, an external exfoliative force (2) was applied between the protective layer 203 and the surface-side filler 202, thus the protective layer 203 was separated from the laminate 208 having the photovoltaic elements, as shown in FIG. 2.

Example 2

Figure 3:
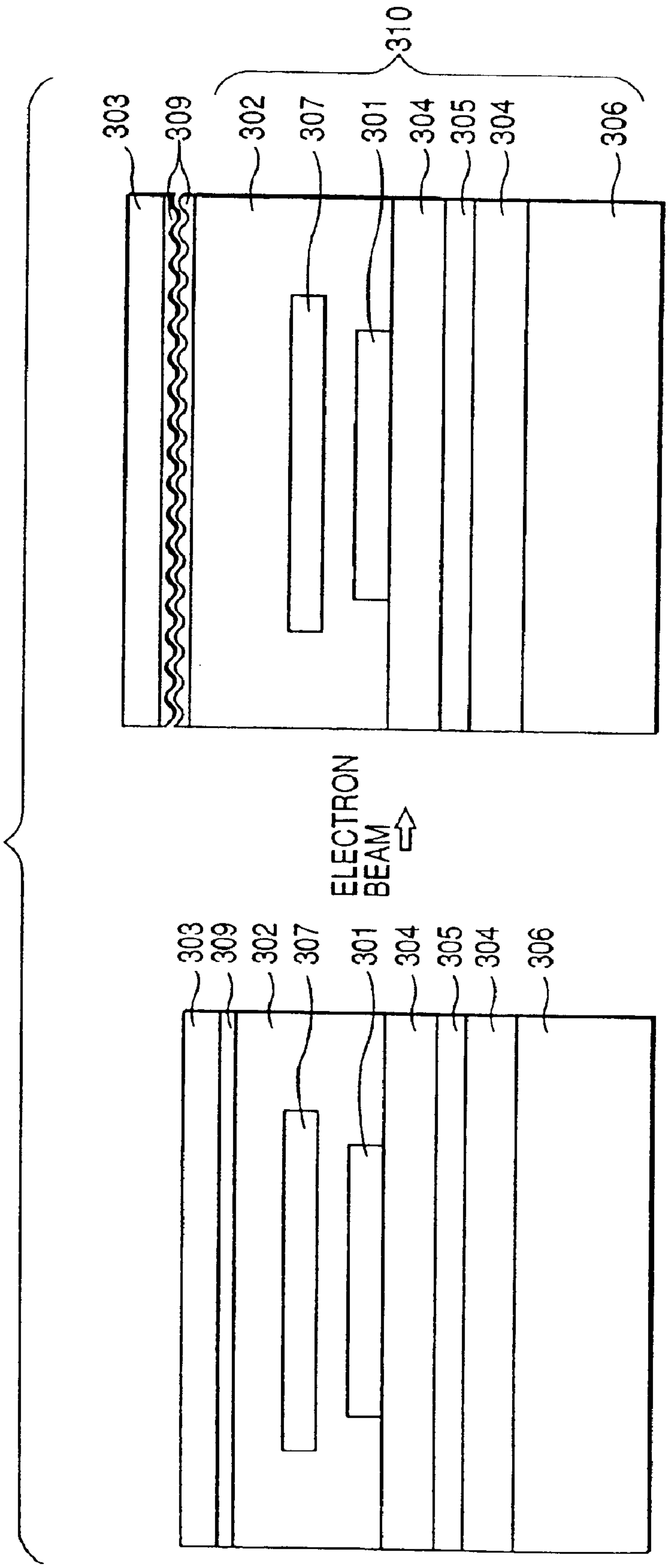
FIG. 3 illustrates a method of dismantling a solar cell module with an exfoliative layer by electron rays according to the present invention, as shown in Example 2.

As shown in FIG. 3, an exfoliative layer 309 was provided on a protective layer 303.

(Formation of Exfoliative Layer)

An acrylic resin coating material (35 parts by weight of an acrylic resin composed chiefly of methacrylate, 3 parts by weight of γ-glycidoxypropyltrimethoxysilane and 62 parts by weight of xylene) was coated on the protective layer 303 by means of a spray coater so as to have a thickness of 20 μm, and the wet coating formed was natural-dried at room temperature for 30 minutes to remove the solvent, followed by force-drying at 120° C. for 30 minutes to form a protective layer 303 having an exfoliative layer 309.

A solar cell module was obtained in the same manner as in Example 1 except that the protective layer 303 was so superposed that the exfoliative layer 309 was on the side of a surface-side filler 302. In FIG. 3, reference numeral 301 denotes a photovoltaic element; 304, a back-side filler; 305, a back insulating material; 306, a supporting substrate; and 307, a surface protection reinforcing material.

(Separation)

The solar cell module was irradiated by electron rays of 300 keV in a total dose of 50 Mrad on the light-receiving side of the solar cell module. Thereafter, external exfoliative force was applied between the protective layer 303 and surface-side filler 302 interposing the exfoliative layer 309, thus the protective layer 303 was separated from the laminate 310 having the photovoltaic elements.

Example 3

Figure 4:
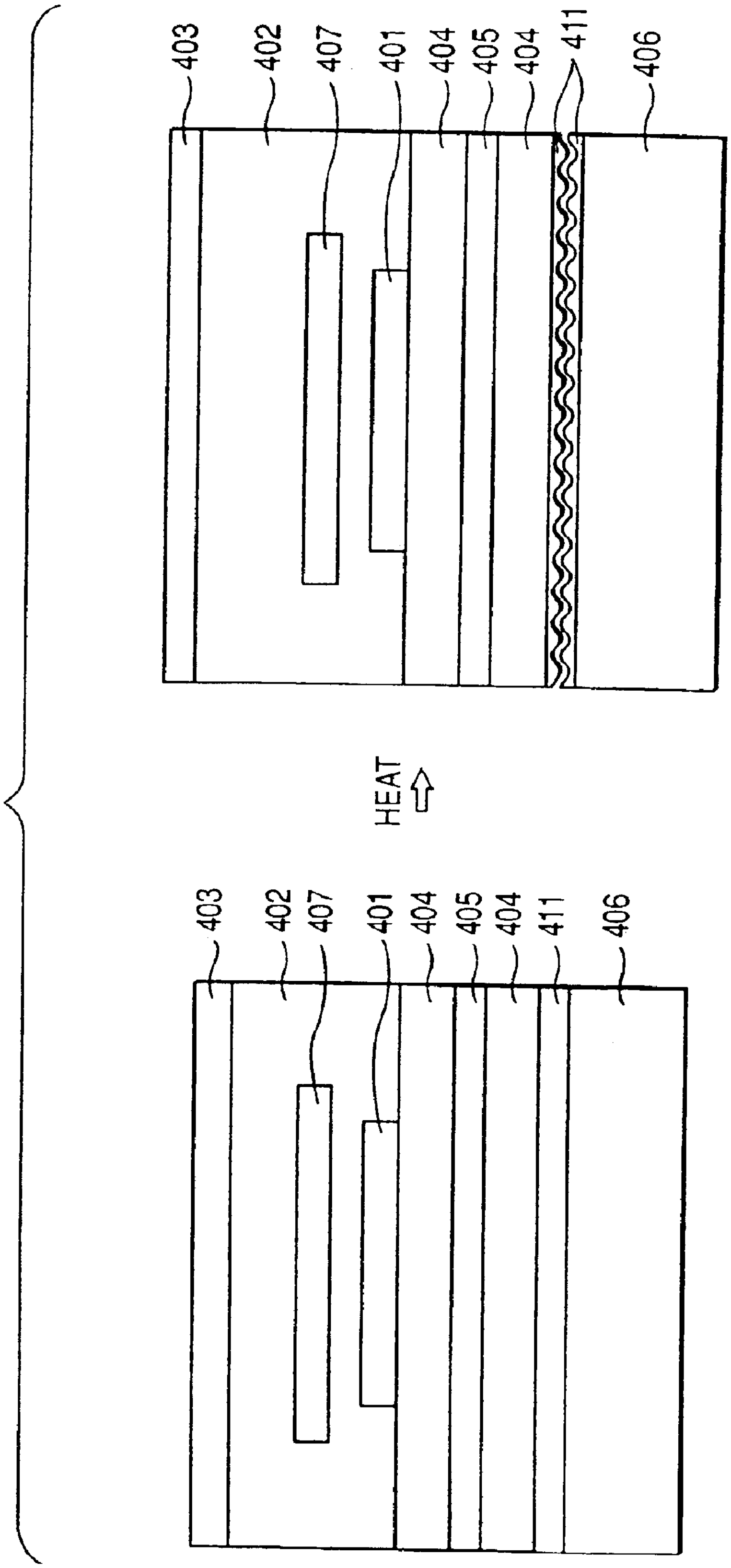
FIG. 4 illustrates a method of dismantling a solar cell module with a foam precursor sheet by heating according to the present invention, as shown in Example 3.

A solar cell module was obtained in the same manner as in Example 1 except that a foam precursor sheet formulated as shown below was superposed as an exfoliative layer 411 as shown in FIG. 4, between a supporting substrate 406 and a back-side filler 404. In FIG. 4, the reference numeral 405 denotes a back insulating material; 401, a photovoltaic element; 407, a surface protection reinforcing material; 402, a surface-side filler; and 403, a protective layer.

(Foam Precursor Sheet)

100 parts by weight of ethylene-vinyl acetate resin (vinyl acetate: 15% by weight; melt flow rate: 9 dg/min), 40 parts by weight of soft calcium carbonate (primary particle diameter: about 3 μm) as a nucleating agent, 5 parts by weight of trihydrazinotriazine as a blowing agent, 1 part by weight of dicumyl peroxide as a cross-linking agent, 0.5 part by weight of stearic acid and 0.1 part by weight of carbon black as a pigment were mixed, and a sheet of 0.5 mm thick was prepared by means of an inverted L four-roll calender.

(Separation)

The solar cell module was heated at 200° C. for 1 hour. Thus, a solar cell module having an exfoliative layer, a foamed sheet, with a thickness of 1.2 mm was obtained. The module was broken at the part of the exfoliative layer, the foamed sheet, by external exfoliative force, thus a laminate having the photovoltaic elements was separated from the supporting substrate.

Example 4

A solar cell module was obtained in the same manner as in Example 1.

(Separation)

The solar cell module was stored in an environment of 150° C., 100% RH and 5 atm pressure. Next, a mechanical exfoliative force was applied between the supporting substrate and the back-side filler, thus a laminate having the photovoltaic elements was separated from the supporting substrate. Thereafter, an external exfoliative force was applied between the protective layer and the surface-side filler, thus the protective layer was separated from the laminate having the photovoltaic elements.

As described above, the semiconductor device of the present invention, as exemplified by the solar cell module, only any constituent member(s) having caused a problem can be separated and reused, if by some chance a problem on product use has occurred at some place as a result of long-term outdoor service. Also, since the exfoliative layer may be formed of a thermoplastic resin, the laminate portion can be separated from the supporting substrate by heating. In addition, since the exfoliative layer may be provided as a degradable resin layer or a foam, the constituent members can be separated with ease by a given means.

The present invention has the following advantages.

(1) After constituent members are separated from semiconductor devices as exemplified by solar cell modules, still serviceable constituent members can be recovered and reused. Stated more specifically, if by some chance a problem on product use has occurred at some place as a result of long-term outdoor service, any constituent member(s), in particular, semiconductor elements as exemplified by photovoltaic elements, having caused the problem can be separated from substrates, and any still serviceable remaining constituent members such as semiconductor elements can be recovered and reused.

(2) Supporting substrates can be separated from solar cell modules which must otherwise be discarded because of corrosion of supporting substrates made of metal or because of break of supporting substrates made of glass, and hence such substrates can be changed for new ones so that the modules can be reused.

(3) Protective layers can be separated from solar cell modules which must otherwise be discarded because of scratches made in protective layers, and hence new protective materials can be set so that the module can be reused.

(4) Since the exfoliative layer can be provided at any desired position, constituent members can be separated from solar cell modules with ease by a given operation.

(5) Since the exfoliative layer can be formed of a thermoplastic resin, the solar cell module can be dismantled into the protective layer, the laminate having photovoltaic elements and the supporting substrate.

(6) Since the exfoliative layer can be provided as a degradable resin layer, the upper and lower constituent members interposing the exfoliative layer can be separated with ease. For example, the resin can be degraded by irradiation with electron rays, or, as another means, can be degraded by biochemical decomposition.

(7) Since a foam can be provided as the exfoliative layer, the upper and lower constituent members interposing the exfoliative layer can be separated with ease. For example, the foam has a small area of adhesion to the adjoining constituent members and has a low adhesion thereto, and hence can be separated at interface with ease. Since also the foam encloses gas internally, the cohesive failure takes place in the foam with ease. Thus, the upper and lower constituent members interposing the foam can-be separated with ease.

What is claimed is:

1. A method of dismantling a semiconductor device having a substrate, a filler, an exfoliative layer comprising an electron ray degradable resin that can be degraded by electron rays to detach constituent member of the device, and a semiconductor element; the method comprising detaching the semiconductor element from the substrate, wherein the exfoliative layer is degraded to detach the constituent members of the device.

2. The method according to claim 1, which comprises the step of irradiating the exfoliative layer with electron rays.

3. The method according to claim 1, wherein the semiconductor device further has a protective layer, and which method comprises the step of removing the filler remaining on the surface and/or back of the semiconductor element after detaching the protective layer and/or substrate of the semiconductor device.

4. The method according to claim 3, wherein the filler is removed with an acid, an alkali or an organic solvent.

5. A method of dismantling a solar cell module having a substrate, a filler, an exfoliative layer comprising an electron ray degradable resin that can be degraded by electron rays to detach constituent member of the module, a photovoltaic element and a protective layer; the method comprising detaching the photovoltaic element from the substrate, wherein the exfoliative layer is degraded to detach the constituent members of the module.

6. The method according to claim 5, which comprises the step of irradiating the exfoliative layer with electron rays.

7. The method according to claim 5, which comprises the step of removing the filler remaining on the surface and/or back of the photovoltaic element after detaching the protective layer and/or substrate of the solar cell module.

8. The method according to claim 7, wherein the filler is removed with an acid, an alkali or an organic solvent.

9. A method of dismantling a semiconductor device having a substrate, a filler, an exfoliative layer comprising an electron ray degradable resin, and a semiconductor element; the method comprising irradiating the exfoliative layer with electron rays to detach at least one of the substrate, the filler and the semiconductor element from the other constituent members of the device.

10. A method of dismantling a solar cell module having a substrate, a filler, an exfoliative layer comprising an electron ray degradable resin, a photovoltaic element and a protective layer; the method comprising irradiating the exfoliative layer with electron rays to detach at least one of the substrate, the filler, the photovoltaic element and the protective layer from the other constituent members of the module.

* * * * *

UNITED STATES PATENT AND TRADEMARK OFFICE

CERTIFICATE OF CORRECTION

PATENT NO. : 6,940,008 B2
APPLICATION NO. : 10/876666
DATED : September 6, 2005
INVENTOR(S) : Hidenori Shiotsuka et al.

It is certified that error appears in the above-identified patent and that said Letters Patent is hereby corrected as shown below:

Column 1,
Line 15, “are use in” should read -- have been used for --;
Line 19, “future,” should read -- the future, --; and
Line 20, “reconstruction” should read -- the reconstruction --.

Column 2,
Line 11, “heaing” should read -- heating --.

Column 4,
Line 12, “environment” should read -- environmental factors --.

Column 5,
Line 21, “deteriorated,” should read -- deteriorated and needs to be replaced, --;
Line 22, “and has to be changed for new one,” should be deleted;
Line 23, “either necessary one” should read -- it can be discarded with ease, and the other member --, and “reused and either unusable one” should read -- reused. --;
Line 24, “can be discarded with ease.” should be deleted, and “the result” should read -- a result --;
Line 31, “strength,” should read -- strength --;
Line 43, “heated and moist-” should read -- heat and moisture --;
Line 44, “ened” should be deleted;
Line 53, “changed for” should read -- replaced with a --, and “whichever” should read -- regardless of which --;
Line 54, “deteriorated,” should read -- detoriorated and needs to be replaced, -- and “element, and” should read -- element. --;
Line 55, “has to be changed for new one.” should be deleted;
Line 58, “the result” should read -- a result --; and
Line 61, “changed for” should read -- replaced with a --.

Column 7,
Lines 16 and 18, “other constituent member” should read -- other constituent members --;
Line 22, “values for” and “condi-” should be deleted; and
Line 23, “tions” should be deleted.

Column 8,
Line 21, “radiations,” should read -- radiations --, and “particle” should read -- the particle --; and
Line 27, “cut to degrade” should read -- break, thereby degrading --.

UNITED STATES PATENT AND TRADEMARK OFFICE

CERTIFICATE OF CORRECTION

PATENT NO. : 6,940,008 B2 
APPLICATION NO. : 10/876666
DATED : September 6, 2005
INVENTOR(S) : Hidenori Shiotsuka et al.

It is certified that error appears in the above-identified patent and that said Letters Patent is hereby corrected as shown below:

Column 9,
Line 36, “more easy” should read -- easier --; and
Line 41, “member” should read -- members --.

Column 11,
Line 19, “filler 204” should read -- layer 204, --;
Line 20, “melt,” shouold read -- melt; --; and
Line 55, “layer 309,” should read -- layer 309; --.

Column 12,
Line 16, “force,” should read -- force; --;
Lines 27 and 31, “filler,” should read -- filler; --; and
Line 33, “the semiconductor” should read -- in the semiconductor --.

Column 13,
Line 28, “constituent member” should read -- constituent members --.

Column 14,
Line 8, “member” should read -- members --.

Signed and Sealed this

Fourth Day of July, 2006

Jon W. Dudas

JON W. DUDAS
*Director of the United States Patent and Trademark Office*